(12) United States Patent
Zhang et al.

(10) Patent No.: US 10,321,553 B2
(45) Date of Patent: Jun. 11, 2019

(54) SHIELD TO IMPROVE ELECTROMAGNETIC INTERFERENCE (EMI) SUPPRESSION CAPABILITY

(71) Applicant: Cisco Technology, Inc., San Jose, CA (US)

(72) Inventors: Hailong Zhang, Shanghai (CN); Xiaoxia Zhou, Shanghai (CN); Jinghan Yu, Shanghai (CN); Philippe Sochoux, San Jose, CA (US); Xiao Li, San Jose, CA (US); Alpesh Bhobe, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 65 days.

(21) Appl. No.: 14/451,360

(22) Filed: Aug. 4, 2014

(65) Prior Publication Data

US 2016/0037692 A1    Feb. 4, 2016

(51) Int. Cl.
*H05K 1/02* (2006.01)
*H05K 9/00* (2006.01)
*H01R 43/00* (2006.01)

(52) U.S. Cl.
CPC ............ *H05K 1/0203* (2013.01); *H05K 1/02* (2013.01); *H05K 1/023* (2013.01); *H05K 9/0024* (2013.01); *H05K 9/0088* (2013.01); *H01R 43/00* (2013.01); *H05K 1/0215* (2013.01); *H05K 2201/066* (2013.01); *H05K 2201/083* (2013.01); *H05K 2201/10409* (2013.01)

(58) Field of Classification Search
CPC ...... H05K 9/0088; H05K 1/02; H05K 1/0203; H05K 2201/066; H05K 1/0215; H05K 1/023; H05K 9/0024; H05K 2201/083; H05K 2201/10409; H01R 43/00
USPC ...... 29/874; 174/35; 361/719, 800, 816, 818
See application file for complete search history.

(56) References Cited

U.S. PATENT DOCUMENTS

| | | | | |
|---|---|---|---|---|
| 6,084,178 A | * | 7/2000 | Cromwell | H01L 23/32 174/16.3 |
| 6,723,917 B1 | * | 4/2004 | Wang | H01L 23/4093 174/383 |
| 2003/0117787 A1 | * | 6/2003 | Nakauchi | H05K 1/0218 361/818 |
| 2005/0045358 A1 | * | 3/2005 | Arnold | H05K 9/0024 174/51 |
| 2006/0185931 A1 | * | 8/2006 | Kawar | G06F 1/18 181/202 |
| 2008/0012123 A1 | * | 1/2008 | Kuo | H01L 23/367 257/713 |
| 2009/0000114 A1 | * | 1/2009 | Rao | H01L 23/552 29/832 |
| 2011/0026234 A1 | * | 2/2011 | Kim | H05K 1/0236 361/800 |
| 2011/0176279 A1 | * | 7/2011 | Zhao | H01L 21/4878 361/720 |

(Continued)

*Primary Examiner* — Mukundbhai G Patel
*Assistant Examiner* — Zhengfu J Feng
(74) *Attorney, Agent, or Firm* — Polsinelli PC

(57) ABSTRACT

An apparatus is described for suppressing EMI emissions in an electrical device. In one example, the apparatus includes absorbing material surrounding at least a portion of an electrical component and electrically conductive material configured to contact at least one side of the absorbing material.

19 Claims, 3 Drawing Sheets

(56) References Cited

U.S. PATENT DOCUMENTS

| | | | |
|---|---|---|---|
| 2012/0281386 A1* | 11/2012 | Kim | H05K 9/0032 |
| | | | 361/818 |
| 2013/0223041 A1* | 8/2013 | Arnold | H01L 23/552 |
| | | | 361/818 |
| 2014/0152417 A1* | 6/2014 | Ebeid | H01F 38/14 |
| | | | 336/84 R |
| 2014/0210059 A1* | 7/2014 | Brodsky | H01L 23/295 |
| | | | 257/659 |
| 2014/0268578 A1* | 9/2014 | Dolci | H05K 9/0049 |
| | | | 361/719 |

* cited by examiner

SHIELD TO IMPROVE ELECTROMAGNETIC INTERFERENCE (EMI) SUPPRESSION CAPABILITY

TECHNICAL FIELD

The present disclosure relates to an apparatus for improving EMI suppression capability in electronic components.

BACKGROUND

Electronic devices such as application-specific integrated circuits (ASICs) used in telecommunications applications often generate or transmit undesirable electromagnetic and radio-frequency interference (electromagnetic interference, or "EMI") that can interfere with the performance of the electronic device. Such transmissions, also referred to as "noise", can degrade the effectiveness and performance of the electronic device. EMI emissions can ultimately lead to system level failure by coupling to cables or leaking out through the ASIC line card.

BRIEF DESCRIPTION OF THE DRAWINGS

There are shown in the drawings examples that are presently preferred it being understood that the disclosure is not limited to the arrangements and instrumentalities shown, wherein.

DESCRIPTION OF EXAMPLE EMBODIMENTS

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.
Overview In one aspect of the present disclosure, an EMI suppression apparatus is provided. The apparatus includes absorbing material surrounding at least a portion of an electrical component, and electrically conductive material configured to contact at least one side of the absorbing material.

In another aspect, a semiconductor device is provided where the semiconductor device includes a printed circuit board, a heat sink, and an EMI suppression shield configured to contact at least one of the printed circuit board or the heat sink. The shield includes electrically conductive material, and absorbing material covered on at least one side by at least a portion the electrically conductive material.

In yet another aspect, an EMI suppressant shield is provided. The EMI suppressant shield includes a layer of absorbing material disposed between a printed circuit board and a heat sink of an electrical device, and conductive material disposed along at least a portion of the layer of absorbing material.

DETAILED DESCRIPTION

Figure 1:
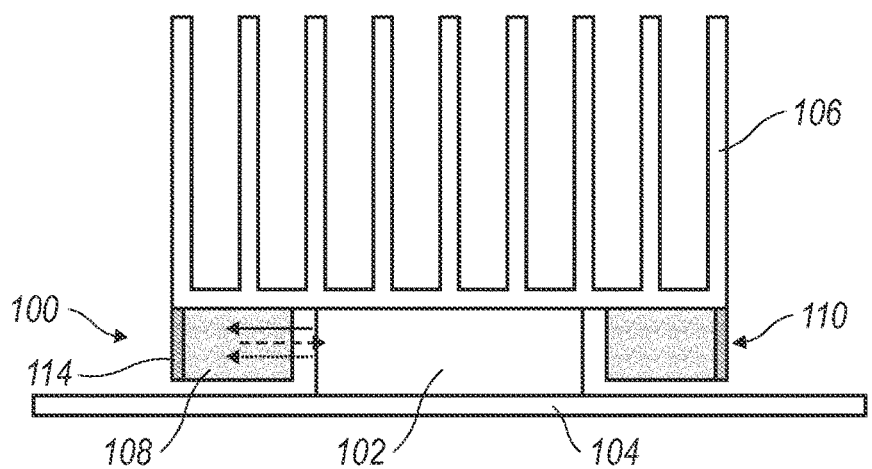
FIG. 1 illustrates a side view of an exemplary shield described herein where conductive material covers an outer periphery of an absorbent material.

FIG. 1 illustrates a side view of an example of the shield described herein. Shield 100 is an apparatus for suppressing EMI emissions in electronic devices. One type of electronic device that shield 100 can be used with is an ASIC 102, which, in one example, includes a printed circuit board 104 and a heat sink 106. Although the examples described herein relate to an EMI suppression device 100 used with an ASIC 102, it should be noted that shield 100 may be used with any electronic device and is not limited to use only with the ASIC 102 depicted in the figures. Shield 100 includes an absorber 108 and conductive material 110. Absorber 108 is made of absorbent material and at least a portion of absorber 108 can be made of elastic. Absorber 108 can be made of any absorbent material including, in one example, Q-ZORB™ material. Conductive material 110 contacts absorber 108 on at least one side. In the example shown in FIG. 1, a layer of absorber 108 is disposed around ASIC 102. Conductive material 110 covers the outer side of absorber 108. At least a portion of conductive material 110 can be made of any conductive material or fabric, such as iron-loaded magnetic material, or conductive paint. Conductive material 110 may contact absorber 108 on any number of sides and therefore shield 100 is not limited to the specific example illustrated in FIG. 1.

FIG. 1 illustrates various "gaps" or "seams" through which undesirable EMI noise can be radiated. For example, EMI noise may radiate from the side gap between ASIC 102 and absorber 108, and through absorber 108, as indicated by the arrows in FIG. 1. FIG. 1 is not to scale and is drawn to emphasize the gaps and seams through which EMI noise may radiate. In the example shown in FIG. 1, a side portion 114 of conductive material 110 covers at least the side portion of absorber 108. Thus, in this example, absorber 108 is essentially "wrapped" by conductive material 110 around its outer periphery. As shown in FIG. 1, any EMI noise emanating from ASIC 102 through the side gap between ASIC 102 and absorber 108 will contact side portion 114 of conductive material 110 and be reflected back towards absorber 108, which will absorb the EMI emission. Thus, the escape of undesirable noise from ASIC 102 through the side gap between ASIC 102 and absorber 108 is minimized due to side portion 114 of conductive material 110. As discussed above, shield 100 may be used with any electronic device. Therefore, shield 100 is equally adaptable to any electronic device including those that may not include a heat sink or be configured in the manner depicted in the attached figures.

Figure 2:
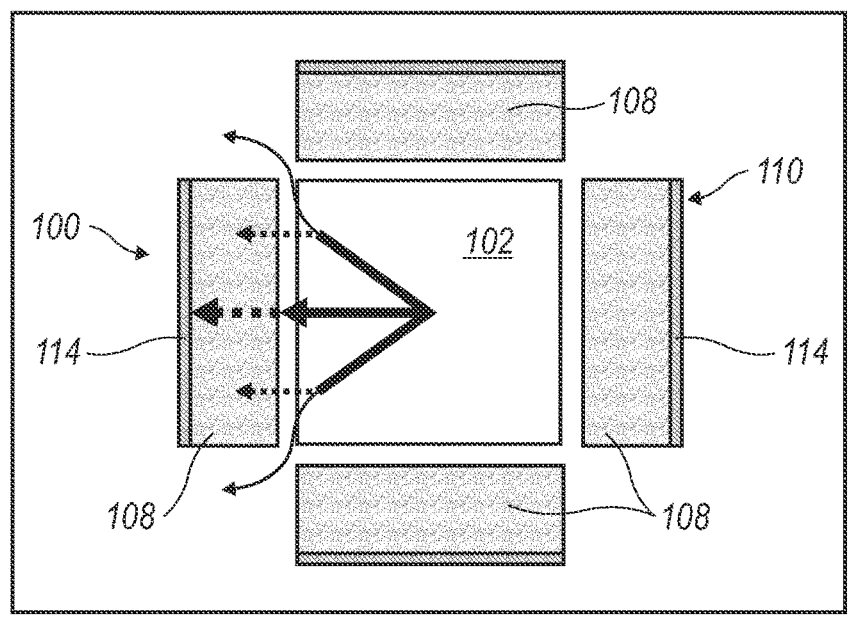
FIG. 2 illustrates a top view of the exemplary shield of FIG. 1.

FIG. 2 illustrates a top view of shield 100 showing how noise emanating from ASIC 102 through the side gap between ASIC 102 and absorber 108 contacts side portion 114 of conductive material 110 of shield 100. The top view of FIG. 2 shows shield 100 configured to at least partially surround ASIC 102. If the electronic device includes a heat sink 106 (not shown in FIG. 2), shield 100 can be configured beneath and in contact with heat sink 106, as shown in FIG. 1. In FIG. 2, shield 100 is shown in four sections surrounding ASIC 102 but this is illustrative only and shield 100 may be configured in various ways adjacent the electronic device, including one continuous layer of absorber 108 or multiple sections of absorber 108. Again, the gaps and spaces between ASIC 102 and shield 100 are exaggerated to better illustrate the spacing. The arrows in FIG. 2 show EMI noise radiating outwardly from ASIC 102. EMI noise can radiate through the side gaps between ASIC 102 and absorber 108, as shown as shown by the arrows in FIG. 2. Although the arrows in FIG. 2 only show EMI noise radiating in one direction, noise can radiate outward from ASIC 102 in all directions. If only absorber 108 is used, then undesirable noise could escape through the outer-facing side of absorber 108. However, conductive material 110 reduces the amount of noise that is emitted. Noise that radiates from ASIC 102 via the side gap between ASIC 102 and absorber 108 instead contacts side portion 114 of conductive material 110 and is reflected back repeatedly towards absorber 108, thus reducing the EMI emission. It should be noted that the top view of FIG. 2 shows only side portion 114 of conductive material 110 for each of the sections of shield 100. However, as discussed throughout this disclosure, shield 100 may include conductive material 110 contacting one or more sides of absorber 108.

Figure 3:
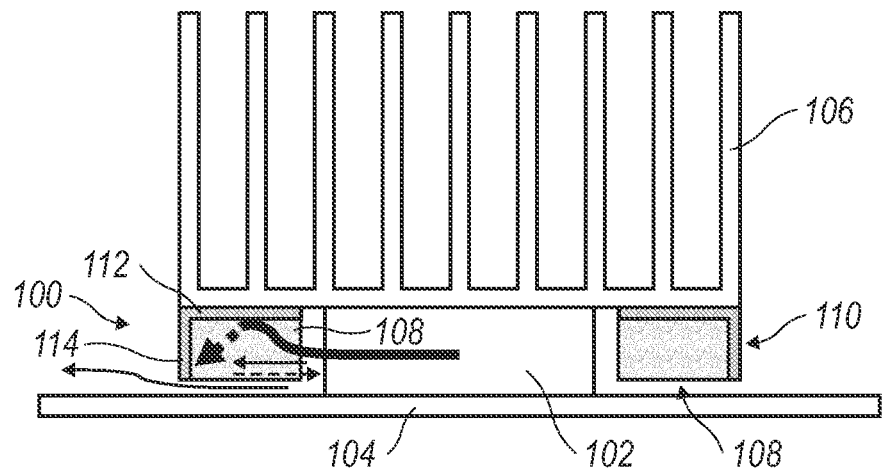
FIG. 3 illustrates a side view of another exemplary shield where conductive material covers two sides of the absorbent material.

FIG. 3 illustrates a side view of another example of shield 100. In this example, shield 100 includes a top portion 112 of conductive material 110 as well as side portion 114 of conductive material 110. In this example, shield 100 includes conductive material 110 wrapped around two sides of absorber 108. In addition to EMI emission via the side gap between ASIC 102 and absorber 108 and through absorber 198 (discussed above and shown in FIGS. 1 and 2), unwanted noise can radiate from the top seam where absorber 108 contacts heat sink 106, Thus, top portion 112 of conductive material 110 minimizes the noise escaping via the top seam between heat sink 106 and absorber 108 while side portion 114 of conductive material 110 minimizes EMI emission radiating from ASIC 102 via the side gap between ASIC 102 and absorber 108. Again, the space between ASIC 102 and absorber 108 is exaggerated for clarity. As shown by the arrows in FIG. 3, while some EMI noise might escape via the bottom seal between PCB 104 and absorber 108, most of the EMI emission contacts side portion 114 and top portion 112 of conductive material 110 and is reflected back towards absorber 108.

Figure 4:
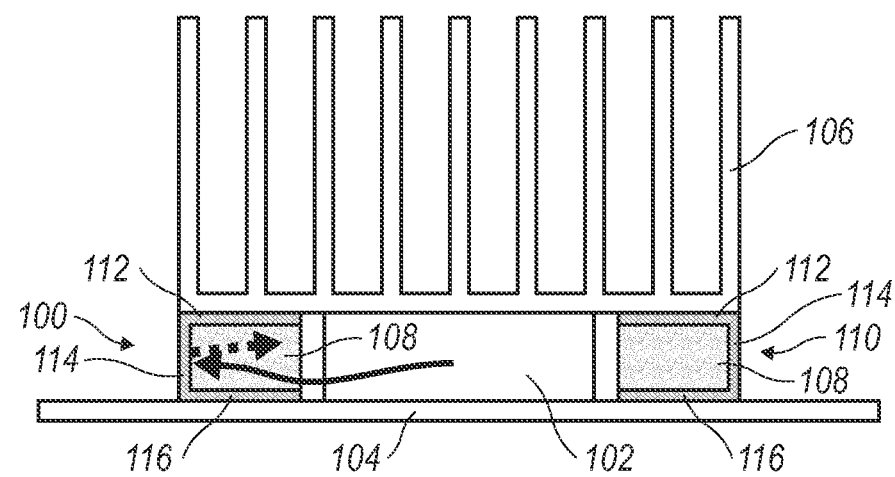
FIG. 4 illustrates a side view of yet another exemplary shield where conductive material covers three sides of the absorbent material.

It is within the scope of the examples shown herein to provide an EMI suppression shield 100 that includes both an absorber 108 and conductive material 110. FIG. 1 and FIG. 2 illustrate various examples of shield 100 where conductive material 110 covers absorber 108 on one side. FIG. 3 and FIG. 4 illustrate various examples of shield 100 where conductive material 110 covers absorber 108 on two sides and three sides, respectively. In the example shown in FIG. 3, top portion 112 of conductive material 110 contacts absorber 108 along its corresponding top side and a side portion 114 contacts absorber 108 along its outer edge. As discussed above, the upper layer of both absorber 108 and conductive material 110 (top portion 112) minimize noise emanating from ASIC 102 through the top seam between heat sink 106 and absorber 108. The dual layer of absorber 108 and conductive material (side portion 114) minimizes noise emanating from ASIC through the side gap between ASIC 102 and absorber 108. If absorber 108 were used alone without conductive material 110, undesirable EMI noise would radiate from the upper seam and the side gap.

FIG. 4 illustrates an example of shield 100, where conductive material 110 covers absorber 108 on three sides. Shield 100 is a combination of conductive material 110 and absorber 108 such that conductive material 110 contacts one or more sides of absorber 108. In FIG. 4, conductive material 110 "wraps" around absorber 108 by contacting it on the top portion and bottom portion and the outer side portion of absorber 108. As described above, top portion 112 of conductive material 110 prevents radiation from escaping between the top seam between heat sink 106 and absorber 108. Bottom portion 116 limits noise from radiating from the bottom seam between the PCB 104 and absorber 108. In this embodiment, bottom portion 116 contacts a metal ground (not shown) of PCB 104 to prevent noise from radiating from the bottom seam. In this fashion, noise is reflected back from top portion 112, side portion 114 and bottom portion 116 and absorbed by absorber 108 repeatedly.

In another embodiment, the three-sided shield 100 of FIG. 4 can be used to minimize noise emission from seams of any mechanical structure, for example, noise emitting from a system chassis cavity through seams or cooling holes. In this fashion, the three-sided shield 100, via portions 112, 114 and 116, could absorb the noise, and then minimize the noise emission by reflecting the noise back through the chassis cavity.

Figure 5:
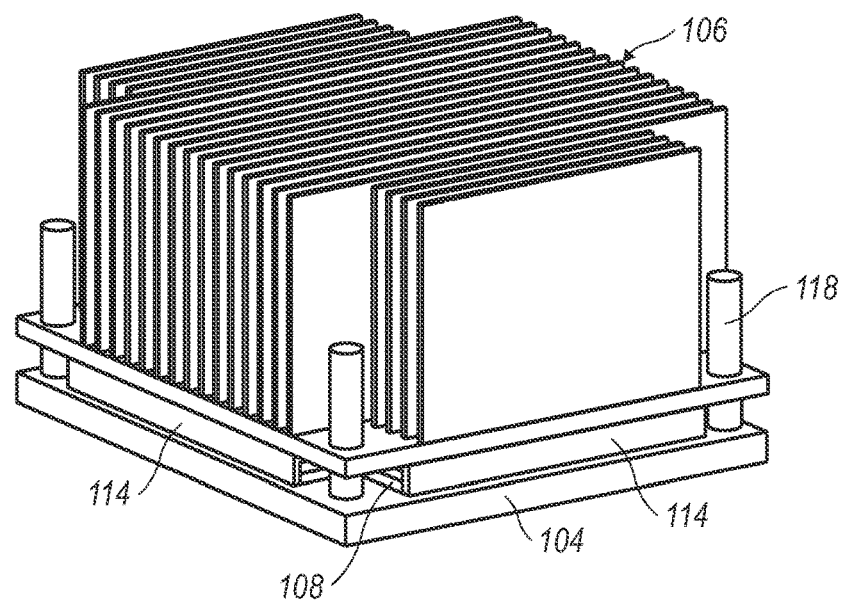
FIG. 5 illustrates a perspective view of an example of the shield described herein.

FIG. 5 is a perspective view of an exemplary shield 100, illustrating its use in minimizing EMI noise emission from an electrical component, such as an ASIC coupled to a heat sink 106. In FIG. 5, shield 100 includes conductive material 110 having one or more sides that "wrap" around absorber 108. Side wall portion 114 can be seen covering absorber 108 on each side (only two sides of absorber 108 are shown in FIG. 5). As described above, any undesirable EMI noise emission from ASIC 102 is minimized by each side wall portion 114 of conductive material 110 and reflected back into absorber 108, thus reducing overall EMI emission. Side wall portion 114 need not cover the entire periphery of absorber 108. For example one or more sides of absorber 108 can be covered by side wall portions 114, depending upon design constraints.

A top portion 112 and/or a bottom portion 116 of conductive material 110 can further envelop absorber 108, thus "sandwiching" absorber 108 between multiple walls of conductive material 110. As will be discussed in more detail below and more clearly illustrated in FIG. 6, additional sections or "tabs" of absorber 108 and conductive material 110 can be included in the four corners where separate sections of absorber 108 may not cover. These additional tabs can be placed in the corner sections between heat sink 106 and PCB 104 to provide additional noise suppression. Cut-out portions of each tab can accommodate screws or bolts 118, which may be used to secure heat sink 106 to PCB 104.

As can be seen in FIG. 5, shield 100 can be used to minimize the amount of EMI noise radiating from an electrical device, such as an ASIC 102. One or more walls of conductive material 110 can be placed over a layer of absorbing material 108 in order to "envelop" the absorber 108. Depending upon design constraints, different combinations of absorber 108 and conductive material 110 can be used at different locations around the electrical component in order to minimize EMI emission through gaps and seams formed between the electrical components and the absorber 108. Shield 100 can be adapted to fit around differently-shaped electrical components.

Figure 6:
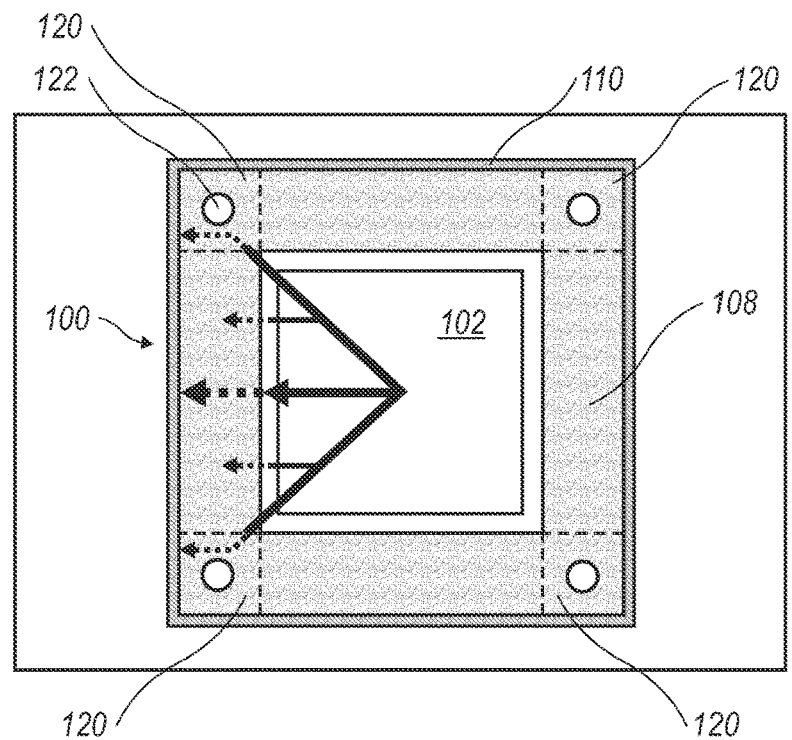
FIG. 6 illustrates a top view of an alternate example of the shield described herein showing corner absorbent tabs between absorbent sections.

FIG. 6 illustrates a top view of an exemplary shield 100. In this example, conductive material 110 surrounds absorber 108, which surrounds ASIC 102. Absorber 108 can include multiple separate sections, in this case four, although the depiction in FIG. 6 is exemplary only and absorber 108 may be made up of one continuous absorbent material or any number of sections of absorbent material. In order to account for spaces where ASIC 102 is exposed, for example, at the corners where separate sections of rectangular absorber 108 abut against each other, the resultant corner gaps may be filled with absorber "tabs" 120, which results in a shield 100 that completely encloses ASIC 102. A layer of conductive material 110 surrounds absorber 108 in order to minimize the EMI noise from ASIC 102. Noise striking conductive material 110 is reflected back in to absorber 108. Holes 122 can be included in each corner absorber tab 120 to accommodate screws or bolts 118 used to secure PCB 104 to heat sink 106.

Absorber tabs 120 need not be of the shape or placed at the exact location illustrated in FIG. 6. For example, depending upon the shape of the electrical component, layers of absorber 108 and conductive material 110 may not completely envelop the electrical component, leaving certain locations that do not contain the combination of absorber 108 and conductive material 110. Absorber tabs 120, which include both absorber 108 and conductive material 110 such that conductive material 110 covers at least a portion of one side of absorber 108, can therefore be placed at any location around, above, or below the electrical component in order provide a shield 100 that minimizes undesirable noise radiating out from the electrical component.

EMI suppression shield 100 described herein, is a combination of absorber 108 and conductive material 110 disposed adjacent an electrical component, such as an ASIC 102. Placing conductive material 110 around one or more sides of the layer of absorbing material 108 results in the EMI noise radiating outward from the electrical component being reflected back where it can then be absorbed by the absorbing material 108. Variations of shield 100 can be used depending upon design and cost restraints, and the configuration of the electrical component. EMI noise radiating between gaps that are formed between, for example, an ASIC 102 and the absorber 108 can be minimized by appropriate-placed layers of conductive material 110. Further, seams created by the abutment between absorber 108 and heat sink 106 or absorber 108 and PCB 104, for example, are locations where EMI noise can radiate through. By including a strip of conductive material 110 over at least a portion of a layer of absorbent material 108, EMI noise radiating through these seams and gaps can be minimized.

It is understood that any specific order or hierarchy of steps in the processes disclosed is an illustration of exemplary approaches. Based upon design preferences, it is understood that the specific order or hierarchy of steps in the processes may be rearranged, or that only a portion of the illustrated steps be performed. Some of the steps may be performed simultaneously. For example, in certain circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more."

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

The specification and drawings are, accordingly, to be regarded in an illustrative rather than a restrictive sense. It will, however, be evident that various modifications and changes may be made thereunto without departing from the broader spirit and scope of various aspects of the disclosure as set forth in the claims.

We claim:

1. An electromagnetic interference (EMI) suppression apparatus comprising:
a heat sink;
an electrical component coupled to a first section of a bottom face of the heat sink;
EMI absorbing material surrounding the electrical component, and directly affixed to a second section of the bottom face of the heat sink, wherein the second section of the bottom face of the heat sink and the first section of the bottom face of the heat sink are different sections of the bottom face of the heat sink; and
electrically conductive material in contact with at least one side of the EMI absorbing material, the at least one side of the EMI absorbing material extending between the electrically conductive material and the electrical component,
wherein,
the EMI absorbing material includes a plurality of separate sections forming a rectangular shape that surrounds the electrical component, and an absorber corner tab disposed between each section of the plurality of separate sections to enclose the electrical component, and
the absorber corner tab including a fastener to secure the electrical component to the heat sink.

2. The apparatus of claim 1, the electrically conductive material comprising at least one of a top section or one or more side sections, wherein the EMI absorbing material is at least partially covered by at least one of the top section or the one or more side sections of the electrically conductive material.

3. The apparatus of claim 2, wherein the electrical component is an application specific integrated circuit (ASIC).

4. The apparatus of claim 1, wherein at least a portion of the conductive material comprises iron-loaded magnetic material.

5. The apparatus of claim 1, wherein at least a portion of the EMI absorbing material comprises Q-ZORB material.

6. The apparatus of claim 1, wherein at least a portion of the EMI absorbing material is elastic.

7. A semiconductor device comprising:
a heat sink;
a printed circuit board having, an electrical component directly coupled to a first section of a bottom face of the heat sink; and
an electromagnetic interference (EMI) suppression shield in contact with at least one of the printed circuit board or a second section of the bottom face of the heat sink,
wherein,
the second section of the bottom face of the heat sink and the first section of the bottom face of the heat sink are different sections of the bottom face of the heat sink,
the shield includes electrically conductive material, and EMI absorbing material covered on at least one side by at least a portion of the electrically conductive material, the EMI absorbing material extending between the portion of the electrically conductive material and the electrical component,
the EMI absorbing material includes a plurality of separate sections forming a rectangular shape that surrounds the electrical component, and an absorber corner tab disposed between each section of the plurality of separate sections to enclose the electrical component, and
the absorber corner tab including a fastener to secure the electrical component to the heat sink.

8. The semiconductor device of claim 7,
wherein,
the electrically conductive material includes at least one of a top section or one or more side sections, and
the EMI absorbing material is at least partially covered by at least one of the top section and the one or more side sections of the electrically conductive material.

9. The semiconductor device of claim 7, wherein the conductive material comprises iron-loaded magnetic material.

10. The semiconductor device of claim 7, wherein at least a portion of the EMI absorbing material comprises Q-ZORB material.

11. The semiconductor device of claim 7, wherein the EMI absorbing material is elastic.

12. An electromagnetic interference (EMI) suppressant shield comprising:

a layer of EMI absorbing material disposed between a printed circuit board and a second section of a bottom face of a heat sink;
an electrical component of the printed circuit board coupled to a first section of the bottom face of the heat sink, the first section of the bottom face of the heat sink and the second section of the bottom face of the heat sink are different sections of the bottom face of the heat sink; and
conductive material disposed along at least a portion of the layer of EMI absorbing material, and extending between the printed circuit board and the heat sink,
wherein
the layer of EMI absorbing material includes a plurality of separate sections forming a rectangular shape that surrounds the electrical component, and an absorber corner tab disposed between each section of the plurality of separate sections to enclose the electrical component, and
the absorber corner tab including a fastener to secure the printed circuit board to the heat sink.

13. The EMI suppressant shield of claim 12, wherein the conductive material is disposed along a plurality of sides defining an outer periphery of the layer of EMI absorbing material.

14. The EMI suppressant shield of claim 12, wherein the conductive material is formed between the second section of the bottom face of the heat sink and the layer of EMI absorbing material, and the layer of EMI absorbing material and the printed circuit board.

15. The EMI suppressant shield of claim 12, wherein absorber corner tab comprises the conductive material at least partially wrapped around the EMI absorbing material.

16. The EMI suppressant shield of claim 12, wherein at least a portion of the layer of EMI absorbing material comprises Q-ZORB material.

17. The EMI suppressant shield of claim 12, wherein at least a portion of the layer of EMI absorbing material is elastic.

18. The EMI suppressant shield of claim 12,
wherein,
the conductive material includes a top section and one or more side sections; and
the layer of EMI absorbing material is at least partially covered by at least one of the top section or the one or more side sections of the conductive material.

19. The semiconductor device of claim 7,
wherein,
the electromagnetic interference (EMI) suppression shield is in contact with the printed circuit board and the second section of the bottom face of the heat sink.

* * * * *